(12) United States Patent
Yin et al.

(10) Patent No.: US 12,269,030 B2
(45) Date of Patent: Apr. 8, 2025

(54) DETECTION CHIP AND MODIFICATION METHOD THEREFOR

(71) Applicant: BOE Technology Group Co., Ltd., Beijing (CN)

(72) Inventors: Yudan Yin, Beijing (CN); Jing Yu, Beijing (CN); Haonan Liu, Beijing (CN); Zhukai Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 692 days.

(21) Appl. No.: 17/631,461

(22) PCT Filed: Mar. 3, 2021

(86) PCT No.: PCT/CN2021/078950
§ 371 (c)(1),
(2) Date: Jan. 29, 2022

(87) PCT Pub. No.: WO2021/185087
PCT Pub. Date: Sep. 23, 2021

(65) Prior Publication Data
US 2022/0274106 A1    Sep. 1, 2022

(30) Foreign Application Priority Data

Mar. 19, 2020    (CN) .......................... 202010197439.3

(51) Int. Cl.
*B01L 3/00*    (2006.01)
*C23C 16/40*    (2006.01)
(Continued)

(52) U.S. Cl.
CPC ...... *B01L 3/502707* (2013.01); *C23C 16/401* (2013.01); *C23C 16/50* (2013.01);
(Continued)

(58) Field of Classification Search
CPC ....... B01L 3/502707; B01L 2200/0689; B01L 2200/12; B01L 2300/0819;
(Continued)

(56) References Cited

U.S. PATENT DOCUMENTS

| | | | |
|---|---|---|---|
| 7,794,799 B1 * | 9/2010 | Kim | B01J 19/0046 427/457 |
| 2005/0059140 A1 * | 3/2005 | Liebmann-Vinson | G01N 33/54353 427/2.14 |

FOREIGN PATENT DOCUMENTS

| CN | 1460723 A | 12/2003 |
|---|---|---|
| CN | 101857900 A | 10/2010 |

(Continued)

OTHER PUBLICATIONS

Deliang Li, et al. "The surface modification of silica with GPTMS." Progress in Chemistry 20.0708 (2008): 1115.
(Continued)

*Primary Examiner* — Jennifer Wecker
*Assistant Examiner* — Britney N. Washington
(74) *Attorney, Agent, or Firm* — IPro, PLLC

(57) ABSTRACT

Disclosed are a detection chip and a modification method therefor. A surface activation treatment is performed on a hydrophilic layer of the detection chip, such that a hydroxy-containing modification group is formed on a surface of the hydrophilic layer; and a solution containing an oxy compound is then used to perform a surface epoxidation treatment on the hydrophilic layer in order to form an epoxy-containing modification group on the surface of the hydrophilic layer.

17 Claims, 3 Drawing Sheets

(51) Int. Cl.
*C23C 16/50* (2006.01)
*C23C 16/56* (2006.01)

(52) U.S. Cl.
CPC ....... *C23C 16/56* (2013.01); *B01L 2200/0689* (2013.01); *B01L 2200/12* (2013.01); *B01L 2300/0819* (2013.01); *B01L 2300/165* (2013.01); *B01L 2400/086* (2013.01)

(58) Field of Classification Search
CPC ......... B01L 2300/165; B01L 2400/086; B01L 2300/161; C23C 16/401; C23C 16/50; C23C 16/56; G01N 33/68
See application file for complete search history.

(56) References Cited

FOREIGN PATENT DOCUMENTS

| CN | 101880712 | A | | 11/2010 |
|---|---|---|---|---|
| CN | 102764677 | A | | 11/2012 |
| CN | 103344759 | A | | 10/2013 |
| CN | 103376319 | A | | 10/2013 |
| CN | 104390949 | A | * | 3/2015 |
| CN | 104807991 | A | | 7/2015 |
| CN | 104923321 | A | | 9/2015 |
| CN | 105548315 | A | | 5/2016 |
| CN | 106434302 | A | | 2/2017 |
| CN | 107603874 | A | | 1/2018 |
| CN | 111266142 | A | | 6/2020 |
| CN | 112326949 | A | | 2/2021 |
| IN | 102879570 | A | | 1/2013 |

OTHER PUBLICATIONS

Mengjun Lai. "Surface modification of polymer microfluidic cell chip." Journal of Third Military Medical University 33.24 (2011): 2571.
Li-min Sun. "Applications of time-of-flight secondary ion mass spectrometry in biomaterials and life science (part II)." Journal of Chinese Mass Spectrometry Society 35.5 (2014): 385.
CN202010197439.3 first office action.
CN202010197439.3 second office action.
CN202010197439.3 Decision of Rejection.

* cited by examiner

DETECTION CHIP AND MODIFICATION METHOD THEREFOR

CROSS REFERENCE TO RELATED APPLICATIONS

The present disclosure claims priority to Chinese Patent Application No. 202010197439.3, filed to the China Patent Office on Mar. 19, 2020 and entitled "DETECTION CHIP AND MODIFICATION METHOD THEREFOR", the entire contents of which are incorporated herein by reference.

FIELD

The present disclosure relates to the technical field of biomedicine, in particular to a detection chip and a modification method thereof.

BACKGROUND

The term "microfluidic chip" originated from the Micro Total Analysis System (μTAS) proposed by Manz and Widmer in the 1990s. Professor Manz successfully applied the MEMS technology to the field of analytical chemistry, and soon realized high-speed capillary electrophoresis on microchips. The results were published in "Science" and other magazines. Since then, this field has quickly received attention from the academic community and has become one of the most cutting-edge technology fields in the world today. Lab on a chip (Lab on a chip) and Microfluidic Chip are different names that people put forward in this field, and as the application of this subject has expanded from the initial analytical chemistry to multiple research and applications fields, and researchers have a deep understanding of this subject, microfluidic chips have become a general term for this field.

Biochips are a kind of chip technology. Its essence is to arrange a series of known recognition molecules in an orderly array on the surface of a substrate so that they can be combined or reacted with a substance to be detected, then displayed and analyzed by a certain method, and finally information such as a chemical molecular structure of the detected substance is obtained. The application of the biochips is very wide, and they can be used in the fields of molecular biology, biomedicine, and drug research and development. Compared with traditional detection methods, the biochips have the characteristics of high throughput, high information content, rapidness, miniaturization, automation, wide application range and so on.

SUMMARY

A modification method of a detection chip provided by an embodiment of the present disclosure, includes:
  performing surface activation treatment on a hydrophilic layer on a first substrate constituting the detection chip to form a hydroxy-containing modification group on a surface of the hydrophilic layer, wherein the hydrophilic layer covers sample application platforms located on the first substrate; and
  performing surface epoxidation treatment on the hydrophilic layer on which the hydroxy-containing modification group is formed, by using a solution containing an oxy compound to form an epoxy-containing modification group on the surface of the hydrophilic layer.

In some embodiments of the present disclosure, the performing the surface epoxidation treatment on the hydrophilic layer, on the surface of which the hydroxy-containing modification group is formed, by using the solution containing the oxy compound, includes:
  placing the first substrate with the hydroxyl-containing modification group formed on the surface of the hydrophilic layer into a toluene solution with 0.5%-5% (v/v) of 3-glyceryl propyl trimethoxy silane, and performing airtight soaking at a temperature condition from a room temperature to 70° C. for 24 h-72 h.

In some embodiments of the present disclosure, the placing the first substrate with the hydroxyl-containing modification group formed on the surface of the hydrophilic layer into the toluene solution with 0.5%-5% (v/v) of 3-glyceryl propyl trimethoxy silane, and performing the airtight soaking at the temperature condition from the room temperature to 70° C. for 24 h-72 h, includes:
  placing the first substrate with the hydroxyl-containing modification group formed on the surface of the hydrophilic layer into a toluene solution with 3% (v/v) of 3-glyceryl propyl trimethoxy silane, and performing airtight soaking at 70° C. for 24 h.

In some embodiments of the present disclosure, the performing the surface activation treatment on the hydrophilic layer on the first substrate constituting the detection chip, includes:
  placing the first substrate with the hydrophilic layer into a piranha solution and soaking at a temperature condition of 70° C.-90° C. for 12 h-24 h, wherein the piranha solution is composed of concentrated sulfuric acid and 30% hydrogen peroxide, and a volume ratio of the concentrated sulfuric acid to the 30% hydrogen peroxide is 1:3.

In some embodiments of the present disclosure, after the surface activation treatment and the surface epoxidation treatment, the first substrate is treated as follows:
  washing the first substrate with deionized water at least twice; and
  blow-drying, after the washed first substrate is ultrasonically cleaned in the deionized water, with nitrogen for use.

In some embodiments, before the performing the surface activation treatment on the hydrophilic layer on the first substrate constituting the detection chip, the modification method further includes:
  performing ultrasonic cleaning on the first substrate with the hydrophilic layer with acetone, ethanol, and deionized water as a solution in sequence, and blow-drying the finally ultrasonically cleaned first substrate with nitrogen for use.

In some embodiments, before the performing the ultrasonic cleaning on the first substrate with the hydrophilic layer with acetone as the solution, the modification method further includes:
  forming a plurality of sample application platforms on the first substrate; and
  forming the hydrophilic layer on each of the sample application platforms respectively.

Optionally, in the above modification method provided by the embodiment of the present disclosure, the forming the hydrophilic layer on each sample application platform respectively, specifically includes:
  depositing a silicon oxide layer with a thickness of 300 nm on a layer where each of the sample application platform is located by using a plasma-enhanced chemical vapor deposition method at a temperature condition of 390° C.; and etching the silicon oxide layer, and reserving the silicon oxide layer covering a region where each sample application platform is located to obtain the hydrophilic layer.

In another aspect, an embodiment of the present disclosure further provides a detection chip, including:

a first substrate;

sample application platforms, located on the first substrate; and a hydrophilic layer, located on the first substrate and covering the sample application platforms, wherein a surface of the hydrophilic layer has a carboxyl-containing modification group; and the carboxyl-containing modification group is obtained by the modification method provided by embodiments of the present disclosure.

In some embodiments, the detection chip further includes:

diversion dams, located on the first substrate, extending along a first path and located between the adjacent sample application platforms, wherein the hydrophilic layer covers the diversion dams, and parts, covering the diversion dams, of the hydrophilic layer are independent of parts, covering the sample application platforms, of the hydrophilic layer.

In some embodiments, a height of the diversion dams in a direction perpendicular to the first substrate is greater than a height of the sample application platforms in the direction perpendicular to the first substrate.

In some embodiments, the detection chip further includes:

a hydrophobic layer, located on the first substrate, wherein the sample application platforms and the diversion dams are both located on the hydrophobic layer.

In some embodiments, the detection chip further includes:

a second substrate, disposed opposite to the first substrate and spaced apart from the first substrate to provide a detection space.

In some embodiments, at least one of the first substrate or the second substrate is a glass substrate.

In some embodiments, the detection chip further includes:

a sealant, located between the first substrate and the second substrate, and surrounding the diversion dams and the plurality of sample application platforms.

DETAILED DESCRIPTION OF THE EMBODIMENTS

Figure 1:
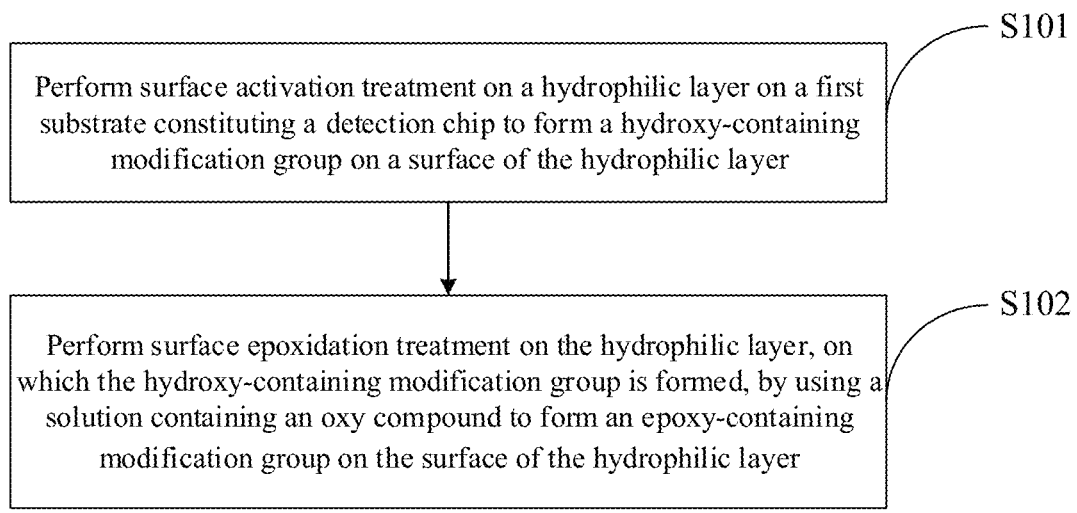
FIG. 1 is a flowchart of a modification method of a detection chip provided by an embodiment of the present disclosure.

In order to make the objectives, technical solutions, and advantages of embodiments of the present disclosure clearer, the technical solutions of the embodiments of the present disclosure will be described clearly and completely with reference to accompanying drawings of the embodiments of the present disclosure. Obviously, the described embodiments are part of, rather than all of, embodiments of the present disclosure. Based on the described embodiments of the present disclosure, all other embodiments obtained by those ordinarily skilled in the art without creative labor fall within the protection scope of the present disclosure.

It should be noted that materials, reagents, etc. used in the following embodiments are commercially available unless otherwise specified. The sizes and shapes of figures in the drawings do not reflect the true scale, and are intended only to schematically illustrate the present disclosure. The same or similar reference numerals refer to the same or similar elements or elements having the same or similar functions throughout.

In the related art, a compound film with epoxy groups or other groups capable of coupling with proteins is generally deposited or spin-coated on a glass substrate to realize production of a detection chip for subsequent protein coupling. However, the glass substrate prepared by a melting process has many defects, resulting in poor adhesion of the above compound film on the glass substrate and proneness to falling off, which affects the efficiency of protein coupling.

To address the above problems in the related art, embodiments of the present disclosure provide a detection chip and a modification method thereof.

In some embodiments, a modification method of a detection chip is as shown in FIG. 1, and includes the following steps.

S101, surface activation treatment is performed on a hydrophilic layer on a first substrate constituting the detection chip to form a hydroxy-containing modification group on a surface of the hydrophilic layer. The hydrophilic layer covers sample application platforms located on the first substrate.

In some embodiments, the hydrophilic layer is generally made of a silicon oxide $SiO_x$ material, and by performing the surface activation treatment on the silicon oxide material, silicon oxide on the surface of the hydrophilic layer may be converted into silicon hydroxyl, that is, the hydroxy-containing modification group is formed on the surface of the hydrophilic layer, as shown in Reaction Formula I.

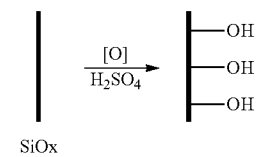

S102, surface epoxidation treatment is performed on the hydrophilic layer, on the surface of which the hydroxy-containing modification group is formed, by using a solution containing an oxy compound to form an epoxy-containing modification group on the surface of the hydrophilic layer.

In some embodiments, the first substrate may be placed in an organic solution of 3-glyceryl propyl trimethoxy silane to form the epoxy-containing modification group on the surface of the hydrophilic layer, as shown in Reaction Formula II.

Reaction Formula II

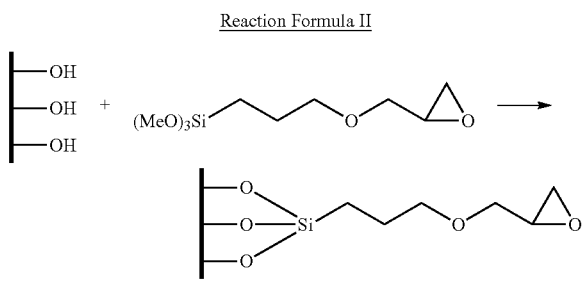

In the above modification method provided by embodiments of the present disclosure, a series of surface chemical reaction operations are performed on a surface of the detection chip, so that epoxy groups connected by chemical bonds are generated on the surface of the hydrophilic layer, which solves the problem in the related art that an epoxy-containing compound film on a detection chip is prone to falling off, and improves the efficiency of subsequent protein coupling. The modification method is suitable for microfluidic systems required for in vitro diagnosis, drug screening, cell culture, immunofluorescence detection, etc.

Optionally, in the above modification method provided by embodiments of the present disclosure, step S102, that is, the surface epoxidation treatment is performed on the hydrophilic layer, on the surface of which the hydroxy-containing modification group is formed, by using the solution containing the oxy compound, may be implemented in the following manner.

The first substrate with the hydroxyl-containing modification group formed on the surface of the hydrophilic layer is vertically placed in an epoxidation fixture according to a fixture structure, a toluene solution with 0.5%-5% (v/v) of 3-glyceryl propyl trimethoxy silane (GPTMS) is injected into the epoxidation fixture, and airtight soaking is performed at a temperature condition from room temperature to 70° C. for 24 h-72 h.

In some embodiments, the volume ratio (v/v) of 3-glyceryl propyl trimethoxy silane (GPTMS) in toluene may be 0.5%, 0.8%, 1%, 1.5%, 2%, 2.5%, 3%, 3.5%, 4%, 4.5%, 5%, etc. Toluene may be ultra-dry toluene. The soaking temperature is room temperature (generally being about 25° C., for example, being 16° C.-18° C. in winter, and 24° C.-26° C. in summer), 30° C., 35° C., 40° C., 45° C., 50° C., 55° C., 60° C., 65° C., 70° C. The soaking time may be 24 h, 30 h, 36 h, 40 h, 48 h, 60 h, 72 h, etc.

In some embodiments, in order to obtain a better epoxidation effect, the first substrate with the hydroxyl-containing modification group formed on the surface of the hydrophilic layer is vertically placed in the epoxidation fixture according to the fixture structure, an ultra-dry toluene solution with 3% (v/v) of 3-glyceryl propyl trimethoxy silane (GPTMS) is injected into the epoxidation fixture, and airtight soaking is performed at a temperature condition of 70° C. for 24 h.

In some embodiments, after above step S102 is performed, it is also necessary to dump a reaction solution. The first substrate is washed with deionized water at least twice, and then ultrasonically cleaned with deionized water for 5 min to remove impurities contaminated on the first substrate in the epoxidation process. Subsequently, the ultrasonically cleaned first substrate is blow-dried with nitrogen, and stored in a nitrogen atmosphere to complete modification for subsequent use in protein coupling.

In some embodiments, in the above modification method provided by embodiments of the present disclosure, step S101, that is, the surface activation treatment is performed on the hydrophilic layer on the first substrate constituting the detection chip, may be implemented in the following manner.

The first substrate with the hydrophilic layer is vertically placed in an activation fixture according to a fixture structure, a piranha solution (concentrated sulfuric acid: 30% hydrogen peroxide=1:3) is prepared on site, and is slowly poured into the above activation fixture without being cooled, and water bath stirring is performed at a condition of 70° C.-90° C. for 12 h-24 h.

In some embodiments, the temperature of the water bath stirring is 70° C., 72° C., 75° C., 80° C., 83° C., 85° C., 88° C., 90° C., etc., and the time of the water bath stirring is 12 h, 15 h, 18 h, 20 h, 21 h, 24 h, etc.

In some embodiments, after above step S101 is performed, it is also necessary to dump the piranha solution and dispose it properly. The first substrate is washed with deionized water at least twice, and then ultrasonically cleaned with deionized water for 10 min to remove impurities contaminated on the first substrate in the activation process. Finally, the first substrate is blow-dried with nitrogen for use.

In some embodiments, before step S101 is performed, that is, before the surface activation treatment is performed on the hydrophilic layer on the first substrate constituting the detection chip, the following step may further be performed.

Acetone, ethanol, and deionized water are used as a solution in sequence to ultrasonically clean the first substrate with the hydrophilic layer, and the finally ultrasonically cleaned first substrate is blow-dried with nitrogen for use.

In some embodiments, after the hydrophilic layer and other film layers are made on a master glass substrate, the master glass substrate being 0.5 mm thick is cut into a standard glass slide of 1 in * 3 in as the first substrate, and the first substrate is loaded into a cleaning fixture to be pre-cleaned. The flow of a cleaning process sequentially includes: ultrasonic cleaning with acetone for 10 min, ultrasonic cleaning with ethanol for 10 min, ultrasonic cleaning with deionized water for 10 min, and another ultrasonic cleaning with deionized water for 10 min. In this way, other impurities such as grease on the first substrate may be cleaned away. After the cleaning, the first substrate is blow-dried with nitrogen for use.

In some embodiments, the following steps may be performed before ultrasonic cleaning is performed on the first substrate with the hydrophilic layer by using acetone as the solution:

a plurality of sample application platforms are formed on the first substrate; and the hydrophilic layer is formed on each sample application platform.

In the related art, the first substrate of the detection chip has a certain degree of hydrophobicity, a solvent contained in a solution to be detected in the biological field is generally water, and therefore, contact between the solution to be detected and the first substrate is poor, which is not conducive to binding of markers in the solution to be detected and the detection chip. Silicon oxide has hydrophilicity so the detection chip provided by the present disclosure can better realize close contact with the solution to be detected, thereby improving the detection effect.

In some embodiments, the forming the hydrophilic layer on each sample application platform may be implemented in the following manner:

a silicon oxide layer with a thickness of 300 nm is deposited on a layer where each sample application platform is located by using a plasma-enhanced chemical vapor deposition (PECVD) method at a temperature condition of 390° C.; and the silicon oxide layer is etched to reserve the silicon oxide layer covering an area where each sample application platform is located to obtain the hydrophilic layer.

The hydrophilic layer made of silicon oxide formed by the above method has the advantages of good film thickness uniformity, fewer pinholes in the film layer, resistance to cracking and so on, so the contact effect between the solution to be detected and the detection chip is better.

It should be noticed that the time, temperature and other parameters that appear in the above modification process are just examples and not as limiting conditions.

Figure 2A:
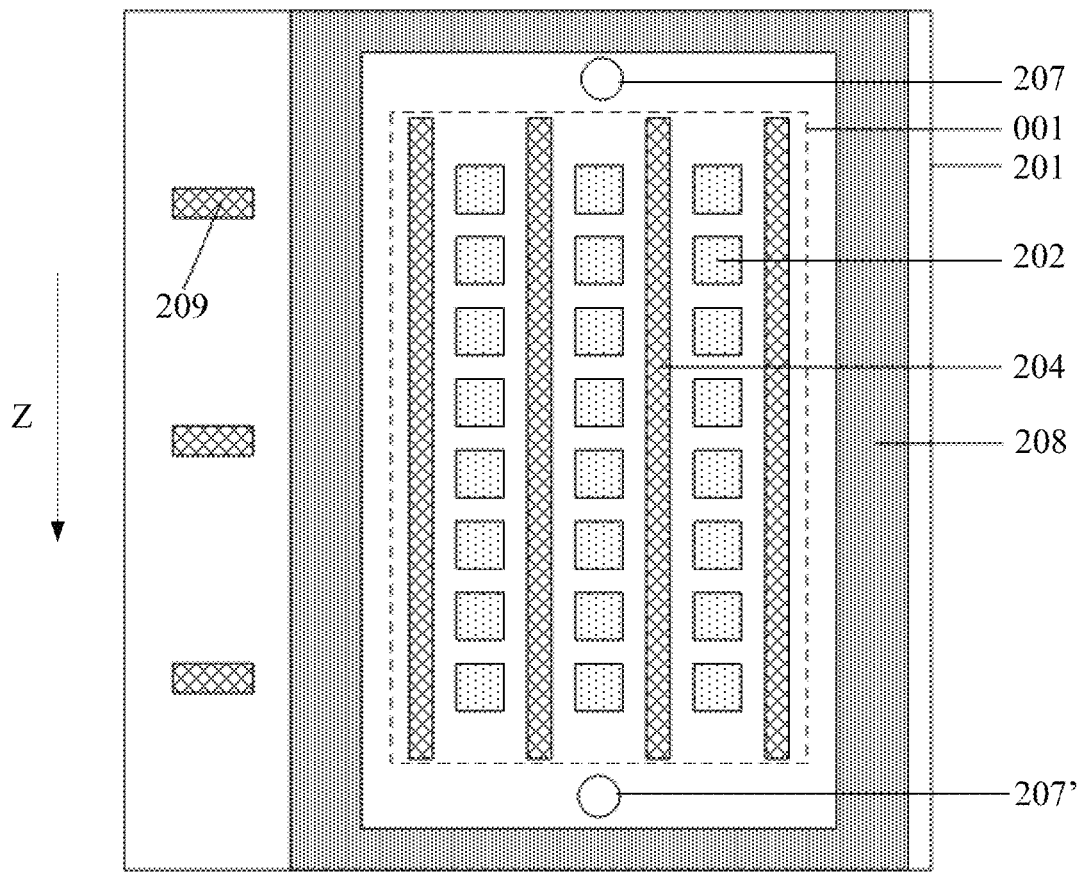
FIG. 2A is a schematic plan view of a detection chip provided by an embodiment of the present disclosure.
Figure 2B:
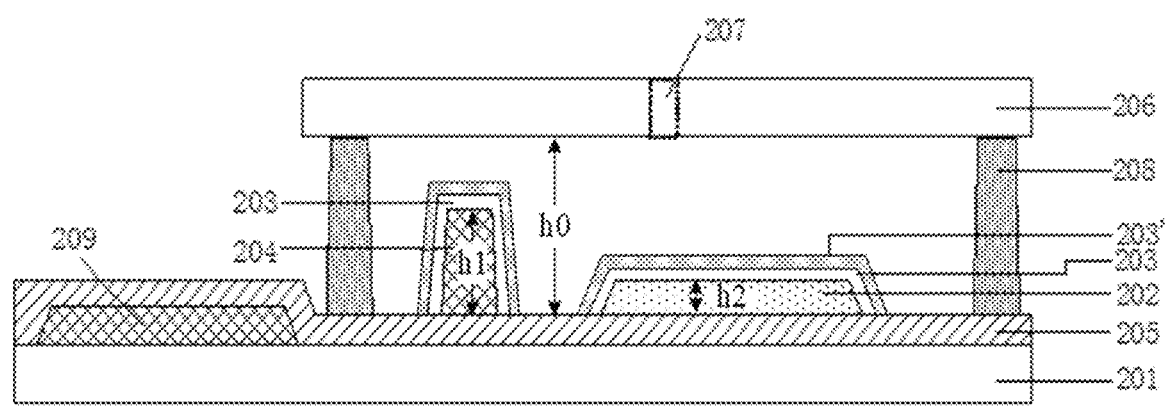
FIG. 2B is a schematic cross-sectional view of a detection chip provided by an embodiment of the present disclosure.

Based on the same inventive concept, an embodiment of the present disclosure further provides a detection chip, as shown in FIGS. 2A and 2B. The detection chip includes: a first substrate 201, sample application platforms 202 located on the first substrate 201, and a hydrophilic layer 203 covering the sample application platforms. A surface of the hydrophilic layer 203 has an amino-containing modification group 203'. The amino-containing modification group is obtained by the above modification method provided by embodiments of the present disclosure.

FIG. 2A is a schematic plan view of a detection chip provided by some embodiments of the present disclosure, and FIG. 2B is a schematic cross-sectional view of the detection chip as shown in FIG. 2A.

Figure 3:
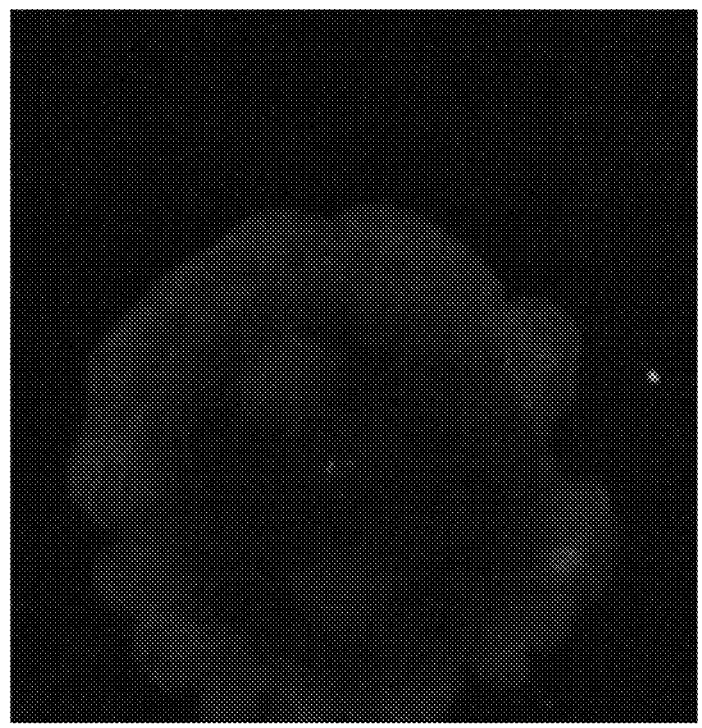
FIG. 3 is a fluorescence image of antibody labeling using a detection chip provided by an embodiment of the present disclosure.

In some embodiments, the modification group 203' on the surface of the hydrophilic layer 203 is obtained by the above modification method provided by the embodiment of the present disclosure, and the modification group 203' has an epoxy group, which may bind to target antigens or antibodies. In some embodiments, in FIG. 3, a lighter-colored region (i.e. the lower part of the picture) shows the test result of the connection efficiency between a fluorescently-labeled antibody and the epoxy group in the modification group 203'. The result proves that the high epoxy grafting density on the surface of the detection chip provided by the present disclosure causes the detection chip to show ultra-high protein coupling efficiency and ultra-low non-specific adsorption when the detection chip binds to proteins such as antibodies.

In some embodiments, the first substrate 201 plays a role of support, protection, etc., may be a plastic substrate, a glass substrate, or a silicon substrate, and may also be other applicable substrates, which is not limited in the embodiments of the present disclosure. For example, when a glass substrate is used, the cost is low; and when a silicon substrate is used, the performance is good. For example, the first substrate 201 is a transparent substrate (such as a glass substrate), so light may pass through the transparent substrate without damage or with low loss, thereby improving the accuracy of subsequent optical inspections and reducing requirements for an additional optical inspection device.

In some embodiments, the plurality of sample application platforms 202 are located on the first substrate 201, and the sample application platforms 202 are, for example, configured to provide attachment positions for the target antigens or antibodies. For example, in some examples, the sample application platforms 202 are in a boss shape, so as to facilitate the binding or reaction of the target antigens or antibodies attached to the sample application platforms 202 with markers in the solution to be detected flowing through the sample application platforms 202. Of course, embodiments of the present disclosure are not limited to this. The sample application platforms 202 may also be in a groove shape or a plane shape, as long as it may be ensured that the target antigens or antibodies attached to the sample application platforms 202 may be in contact with the solution to be detected flowing through the sample application platforms 202 and bind to marks therein. It should be noted that, in embodiments of the present disclosure, the quantity of the sample application platforms 202 is not limited and may be any number, for example, it depends on the type or concentration of markers to be detected.

In some embodiments, the above detection chip, as shown in FIGS. 2A and 2B, may further include: diversion dams 204 located on the first substrate 201. The diversion dams 204 extend along a first path and are located between the adjacent sample application platforms 202. The hydrophilic layer 203 covers the diversion dams 204, and parts, covering the diversion dams 204, of the hydrophilic layer 203 are independent of parts, covering the sample application platforms 202, of the hydrophilic layer 203.

In some embodiments, the diversion dams 204 are located on the first substrate 201, and the diversion dams 204 extend along the first path and are located between adjacent sample application platforms 202. The diversion dams 204 influence a flow field of an internal space of the detection chip, thereby improving the uniformity of flow velocities of positions where the different sample application platforms 202 are located, improving the parallelism of the flow field along the first path, and improving the stability of the flow field, so the solution to be detected may stably and uniformly flow through the region where the sample application platforms 202 are located. Therefore, the markers in the solution to be detected may fully bind to or react with the target antigens or antibodies on the sample application platforms 202, thereby helping to improve the accuracy and reliability of an immunological detection result. In addition, the detection chip further has the characteristics of small size, high throughput, etc.

For example, in some examples, as shown in FIG. 2A, the plurality of sample application platforms 202 are arranged into a plurality of columns, and the first path extends in a column direction Z. The diversion dams 204 are disposed on both sides of each column of sample application platforms 202, and the plurality of diversion dams 204 are parallel to one another. When the solution to be detected flows through the plurality of sample application platforms 202 in the column direction Z, under the action of the diversion dams 204, the parallelism of the flow field formed by flowing of the solution to be detected in the column direction Z is improved, so the solution to be detected may flow stably and uniformly in the column direction Z.

It should be noted that, in some embodiments of the present disclosure, the first path is not limited to extending in the column direction Z, and may also extend in any other direction. In addition, the first path may extend along a straight line or a curve, and may be determined according to the flow path and flow manner of the solution to be detected, which is not limited in the embodiment of the present disclosure. For example, when the first path extends along the straight line, the diversion dams 204 also extend along a straight line; and when the first path extends along the curve, the diversion dams 204 also extend along a curve. Correspondingly, the plurality of sample application platforms 202 may be arranged in a plurality of columns along a straight line, or may be arranged in a plurality of groups along a curve, and the diversion dams 204 located between the adjacent sample application platforms 202 just extend in the arrangement direction of the sample application platforms 202.

It should be noted that, in some embodiments of the present disclosure, the diversion dams 204 may be disposed on both sides of each column of sample application platforms 202, or on both sides of only some columns of sample application platforms 202, which may be determined according to the flow field parallelism that needs to be achieved, and is not limited in the embodiment of the present disclosure.

In some embodiments, when the diversion dams 204 are disposed on both sides of each column of sample application platforms 202 (for example, when the sample application platforms 202 and the diversion dams 204 are disposed as shown in FIG. 2A), the flow field has good parallelism. If a target antigen or antibody on a certain sample application platform 202 accidentally falls off, the target antigen or antibody that falls off may flow in the column direction Z, namely, flowing in a region where the sample application platform 202 is located, so that other columns of sample application platforms 202 may not be influenced, crosstalk between different detection sites (i.e. the sample application platforms 202) may be avoided accordingly, and cross-contamination may be avoided.

In some embodiments, the quantity of the diversion dams 204 is not limited, and there may be one or more diversion dams 204. For example, in some examples, if the plurality of sample application platforms 202 are arranged in only two columns, there may be only one diversion dam 204 disposed, and the diversion dam 204 may be located between the two columns of sample application platforms 202, so the flow field has good parallelism while the quantity of the diversion dams 204 is reduced.

In some embodiments, the cross-sectional shape of the diversion dams 204 in a direction perpendicular to the first path (for example, the column direction Z) may be a rectangle, a square, a trapezoid, a semicircle or other suitable shapes, for example, a regular shape or irregular shape, which is not limited in the embodiment of the present disclosure. For example, different cross-sectional shapes may have different effects on the flow field, so the cross-sectional shape of the diversion dams 204 may be determined according to features of the flow field.

In some embodiments, both the diversion dams 204 and the sample application platforms 202 may be made of photoresist, and the photoresist is, for example, thick film etchable photoresist. For example, in some examples, the diversion dams 204 and the sample application platforms 202 may be formed in the same patterning process to simplify the production process.

In some embodiments, the above detection chip, as shown in FIG. 2B, may further include: a hydrophobic layer 205 located on the first substrate 201. The sample application platforms 202 and the diversion dams 204 are both located on the hydrophobic layer 205. By disposing the hydrophobic layer 205, the solution to be detected may flow more easily in the detection chip, and the markers in the solution to be detected may be not prone to adhering to the first substrate 201, so as to prevent the markers in the solution to be detected from being wasted.

In some embodiments, a material of the hydrophobic layer 205 is resin or silicon nitride. Of course, the hydrophobic layer 205 may also be made of other suitable inorganic or organic material, as long as it is ensured that a side, away from the first substrate 201, of the hydrophobic layer 205 is hydrophobic. For example, the hydrophobic layer 205 may be directly prepared with a hydrophobic material. For another example, the hydrophobic layer 205 may be made of a material that does not have hydrophobicity, in this case, it is necessary to perform hydrophobic treatment on a surface, away from the first substrate 201, of the hydrophobic layer 205, so the surface, away from the first substrate 201, of the hydrophobic layer 205 is hydrophobic.

In some embodiments, as shown in FIG. 2B, may further include: a second substrate 206 disposed opposite to the first substrate 201, and the second substrate 206 is spaced apart from the first substrate 201 to provide a detection space (i.e. a liquid flow space). A material of the second substrate 206 may be the same as or different from the material of the first substrate 201, which is not limited in the embodiment of the present disclosure. For example, the second substrate 206 is a transparent substrate (for example, a glass substrate), so light may pass through the transparent substrate without damage or with low loss, thereby improving the accuracy of subsequent optical inspections and reducing the requirements for the additional optical inspection devices.

In some embodiments, as shown in FIG. 2A, may further include a sample inlet 207, a sample outlet 207' and a detection region 001. For example, the plurality of sample application platforms 202 are located in the detection region 001, and are arranged in a plurality of columns, and the sample inlet 207 and the sample outlet 207' are distributed on both sides of the detection region 001 in the column direction Z (for example, located on the upper and lower sides in the figure). For example, the solution to be detected may be injected into the sample inlet 207 through a microsyringe pump or a pipette, and flows out of the sample outlet 207' after flowing through the plurality of sample application platforms 202 in the column direction Z. For example, the sample inlet 207 and the sample outlet 207' are axially symmetrically or centrally distributed on both sides of the detection region 001 in the column direction Z, so that the parallelism and stability of the flow field may be further improved. Of course, the embodiment of the present disclosure is not limited to this, and the sample inlet 207 and the sample outlet 207' may also be distributed asymmetrically, which may be determined according to the features of the flow field and actual requirements.

In some embodiments, the sample inlet 207 and the sample outlet 207' are disposed in the second substrate 206. For example, as shown in FIG. 2B, the sample inlet 207 may be a through hole penetrating through the second substrate 206, and a shape of the through hole in a cross section parallel to the second substrate 206 may be any suitable shape such as a circle, a rectangle and a square. Similarly, the sample outlet 207' may also be a through hole penetrating through the second substrate 206, and a shape of the sample outlet 207' in the cross section parallel to the second substrate 206 may be the same as or different from the shape of the sample inlet 207. It should be noted that FIG. 2B only schematically shows an arrangement manner of the sample inlet 207 in the second substrate 206, but relative positions of the sample inlet 207 and the sample application platforms 202 are not limited by the situation shown in FIG. 2B.

In some embodiments, the above detection chip, as shown in FIG. 2B, may further include: sealant 208 located between the first substrate 201 and the second substrate 206, and the sealant 208 surrounds the diversion dams 204 and the plurality of sample application platforms 202 as a supporting member. Specifically, the first substrate 201, the second substrate 206, and the sealant 208 jointly define the flow space of the solution to be detected. For example, in some examples, a spacer may be mixed in the sealant 208, so that spacing between the first substrate 201 and the second substrate 206 may be controlled by the spacer, and the compression strength of the detection chip may be enhanced.

In some embodiments, in the above detection chip, as shown in FIG. 2B, a height h1 of the diversion dams 204 in a direction perpendicular to the first substrate 201 is greater than a height h2 of the sample application platforms 202 in the direction perpendicular to the substrate 201, so a role of adjusting the parallelism of the flow field may be better played. Specifically, the height h1 of the diversion dams 204 is 30% to 60%, for example, 40% or 50%, of a distance h0 between the first substrate 201 and the second substrate 206. For example, in some examples, the distance h0 between the first substrate 201 and the second substrate 206 is 100 micrometers, the height h1 of the diversion dams 204 is 50 micrometers, the height h2 of the sample application platforms 202 is 3 micrometers, and the height difference between h1 and h2 is large, so the parallelism of the flow field may be better adjusted. For example, in some examples, when the cross-sectional shape of the diversion dams 204 in the direction perpendicular to the first path (for example, the column direction Z) is a semicircle, the radius of the semicircle may be greater than or equal to half of the distance h0 between the first substrate 110 and the second substrate 206.

It should be noted that in embodiments of the present disclosure, the height h1 may refer to the height of the diversion dams 204 itself, and may also refer to the sum of the heights of the diversion dams 204 and the hydrophilic layer 203. Similarly, the height h2 may refer to the height of the sample application platforms 202 itself, and may also refer to the sum of the heights of the sample application platforms 202 and the hydrophilic layer 203.

In some embodiments, when the above detection chip is used, first, the target antigens or antibodies are attached to the sample application platforms 202 before the first substrate 201 and the second substrate 206 are aligned. For example, liquid containing the target antigens or antibodies may be dropped on the sample application platforms 202, and due to the presence of the modification group 203', the target antigens or antibodies bind to the modification group 203', so as to be attached to the sample application platforms 202. Then, the first substrate 201 and the second substrate 206 are aligned by using the sealant 208. Next, the solution to be detected is injected from the sample inlet 207, and the solution to be detected flows through the detection region 001 and flows out of the sample outlet 207'. When the markers in the solution to be detected flow through the sample application platforms 202, the markers may bind to or react with the target antigens or antibodies attached to the sample application platforms 202. Then, for example, a bovine serum albumin (BSA) solution may be injected into the detection chip to clean the internal space of the detection chip, so the adsorption of the solution to be detected in the internal space of the detection chip except for the sample application platforms 202 is reduced, and the accuracy of subsequent detection is improved. Finally, the optical detection device is used to perform optical detection on the detection chip to obtain immunological detection results.

In some embodiments, the above detection chip, as shown in FIGS. 2A and 2B, may further include positioning components 209. The positioning components 209 are matched with the additional optical detection device to realize positioning of the detection chip, so as to facilitate the optical detection of the detection chip by the optical detection device. For example, the positioning components 209 are disposed on the first substrate 201 and are covered by the hydrophobic layer 205. The positioning components 209 may be made of a metal material, such as molybdenum (Mo), or may be made of an opaque insulating material, which is not limited in the embodiment of the present disclosure.

In some embodiments, during positioning, an optical positioning device of the optical detection device emits light for positioning, if the detection chip is located at a preset position, since the positioning components 209 are opaque, the light intensity detected by a sensor disposed at a corresponding position is very small or zero, and thus it may be determined that the detection chip is located at the preset position to realize positioning. After the positioning is completed, the optical detection device may be used to perform optical detection and signal reading on a specific site. For example, the specific site is a certain sample application platform(s) 202 on which the target antigen or antibody is attached.

In some embodiments, the positioning components 209 are located outside the detection region 001, for example, being further located outside the liquid flow space formed by the first substrate 201, the second substrate 206 and the sealant 208, so as to avoid affecting the optical detection. For example, in some examples, as shown in FIG. 2A, the plurality of positioning components 209 are disposed on one side of the detection chip and close to an edge of the detection chip. By providing the plurality of positioning components 209, the positioning accuracy can be improved. Of course, the embodiment of the present disclosure is not limited to this. The positions where the positioning components 209 are disposed may be determined according to actual needs, for example, the positioning components 209 may be disposed on any side, any two sides, periphery or other suitable positions of the detection chip, which may depend on a positioning manner of the optical inspection device matched therewith. The quantity of the positioning components 209 is not limited either, and may be any number, which may be determined according to actual needs.

Based on the same inventive concept, an embodiment of the present disclosure further provides a reaction system, including: the above detection chip provided by embodiments of the present disclosure. Since the principle of the reaction system to solve the problems is similar to the principle of the above detection chip to solve the problems, the implementation of the reaction system provided by embodiments of the present disclosure may refer to the implementation of the above detection chip provided by embodiments of the present disclosure, which will not be repeated here.

Based on the above description, in the above detection chip and the modification method thereof provided by embodiments of the present disclosure, the activation treatment is performed on the hydrophilic layer of the detection chip to form the hydroxyl-containing modification group on the surface of the hydrophilic layer; and then the surface epoxidation treatment is performed on the hydrophilic layer by using the solution containing the oxy compound to form the high-density epoxy-containing modification group on the surface of the hydrophilic layer. In other words, through the above series of surface chemical reactions, the epoxy groups connected by the chemical bonds are generated on the surface of the hydrophilic layer, which solves the problem that in the related art, the epoxy-containing compound film on the detection chip is prone to falling off, and improves the efficiency of subsequent protein coupling. The detection chip and the modification method thereof are suitable for microfluidic systems required for in vitro diagnosis, drug screening, cell culture, immunofluorescence detection, etc. In addition, the above modification method provided by the present disclosure is implemented based on the glass substrate, which not only facilitates mass production, but also effectively reduces the cost. In addition, it can be seen from the above description that the operation flow of the above modification method provided by the present disclosure is relatively simple and the efficiency can be improved.

It should be noted that the present disclosure uses the above embodiments to illustrate the technical method of the present disclosure, but the present disclosure is not limited to the above technical steps, that is, it does not mean that the present disclosure must rely on the above technical steps to be implemented. Those skilled in the art should understand that any improvement to the present disclosure, equivalent replacement of raw materials selected in the present disclosure, addition of auxiliary components, selection of specific manners, etc., fall within the scope of protection and disclosure of the present disclosure.

What is claimed is:

1. A modification method of a detection chip, comprising:
    performing surface activation treatment on a hydrophilic layer on a first substrate constituting the detection chip to form a hydroxy-containing modification group on a surface of silicon oxide of the hydrophilic layer, thereby converting the silicon oxide to silicon hydroxyl, wherein the hydrophilic layer covers sample application platforms located on the first substrate; and
    performing surface epoxidation treatment on the hydrophilic layer on which the hydroxy-containing modification group is formed, by using a solution containing an oxy compound to form an epoxy-containing modification group on a surface of the hydrophilic layer.

2. The modification method according to claim 1, wherein the performing the surface epoxidation treatment on the hydrophilic layer comprises:
    placing the first substrate with the hydroxyl-containing modification group formed on the surface of the hydrophilic layer into a toluene solution with 0.5%-5% (v/v) of 3-glyceryl propyl trimethoxy silane, and performing airtight soaking at a temperature condition from a room temperature to 70° C. for 24 h-72 h.

3. The modification method according to claim 2, wherein the placing the first substrate with the hydroxyl-containing modification group formed on the surface of the hydrophilic layer into the toluene solution with 0.5%-5% (v/v) of 3-glyceryl propyl trimethoxy silane, and performing the airtight soaking at the temperature condition from the room temperature to 70° C. for 24 h-72 h, comprises:
    placing the first substrate with the hydroxyl-containing modification group formed on the surface of the hydrophilic layer into a toluene solution with 3% (v/v) of 3-glyceryl propyl trimethoxy silane, and performing airtight soaking at 70° C. for 24 h.

4. The modification method according to claim 1, wherein the performing the surface activation treatment on the hydrophilic layer on the first substrate constituting the detection chip, comprises:
    placing the first substrate with the hydrophilic layer into a piranha solution and soaking at a temperature condition of 70° C.-90° C. for 12 h-24 h, wherein the piranha solution comprises concentrated sulfuric acid and 30% hydrogen peroxide, and a volume ratio of the concentrated sulfuric acid to the 30% hydrogen peroxide is 1:3.

5. The modification method according to claim 1, wherein after the surface activation treatment and the surface epoxidation treatment, the first substrate is treated as follows:
    washing the first substrate with deionized water at least twice; and
    blow-drying, after the washed first substrate is ultrasonically cleaned in the deionized water, with nitrogen for use.

6. The modification method according to claim 1, wherein before the performing the surface activation treatment on the hydrophilic layer on the first substrate constituting the detection chip, further comprising:
    performing ultrasonic cleaning on the first substrate with the hydrophilic layer with acetone, ethanol, and deionized water as a solution in sequence, and blow-drying the finally ultrasonically cleaned first substrate with nitrogen for use.

7. The modification method according to claim 6, wherein before the performing the ultrasonic cleaning on the first substrate with the hydrophilic layer with acetone as the solution, further comprising:
    forming a plurality of sample application platforms on the first substrate; and
    forming the hydrophilic layer on each of the sample application platforms respectively.

8. The modification method according to claim 7, wherein the forming the hydrophilic layer on each of the sample application platforms respectively, comprises:
    depositing a silicon oxide layer with a thickness of 300 nm on a layer where each of the sample application platforms is located by using a plasma-enhanced chemical vapor deposition method at a temperature condition of 390° C.; and
    etching the silicon oxide layer, and reserving the silicon oxide layer covering a region where each of the sample application platforms is located to obtain the hydrophilic layer.

9. A detection chip, comprising:
    a first substrate;
    sample application platforms, located on the first substrate; and
    a hydrophilic layer, located on the first substrate and covering the sample application platforms, wherein a surface of the hydrophilic layer comprises a carboxyl-containing modification group; and
    the carboxyl-containing modification group is obtained by the modification method according to claim 1.

10. The detection chip according to claim 9, further comprising:
    diversion dams, located on the first substrate, extending along a first path and located between the adjacent sample application platforms; wherein
    the hydrophilic layer covers the diversion dams, and parts, covering the diversion dams, of the hydrophilic layer are independent of parts, covering the sample application platforms, of the hydrophilic layer.

11. The detection chip according to claim 10, wherein a height of the diversion dams in a direction perpendicular to the first substrate is greater than a height of the sample application platforms in the direction perpendicular to the first substrate.

12. The detection chip according to claim 10, further comprising:
a hydrophobic layer, located on the first substrate, wherein the sample application platforms and the diversion dams are located on the hydrophobic layer.

13. The detection chip according to claim 10, further comprising:
a second substrate, disposed opposite to the first substrate and spaced apart from the first substrate to provide a detection space.

14. The detection chip according to claim 13, wherein at least one of the first substrate or the second substrate is a glass substrate.

15. The detection chip according to claim 13, further comprising:
a sealant, located between the first substrate and the second substrate, and surrounding the diversion dams and the plurality of sample application platforms.

16. A modification method of a detection chip, comprising:
performing surface activation treatment on a hydrophilic layer on a first substrate constituting the detection chip to form a hydroxy-containing modification group on a surface of the hydrophilic layer, wherein the hydrophilic layer covers sample application platforms located on the first substrate; and
performing surface epoxidation treatment on the hydrophilic layer on which the hydroxy-containing modification group is formed, by using a solution containing an oxy compound to form an epoxy-containing modification group on a surface of the hydrophilic layer; and wherein the performing the surface epoxidation treatment on the hydrophilic layer comprises: placing the first substrate with the hydroxyl-containing modification group formed on the surface of the hydrophilic layer into a toluene solution with 0.5%-5% (v/v) of 3-glyceryl propyl trimethoxy silane.

17. A modification method of a detection chip, comprising: performing surface activation treatment on a hydrophilic layer on a first substrate constituting the detection chip to form a hydroxy-containing modification group on a surface of the hydrophilic layer, wherein the hydrophilic layer covers sample application platforms located on the first substrate; and performing surface epoxidation treatment on the hydrophilic layer on which the hydroxy-containing modification group is formed, by using a solution containing an oxy compound to form an epoxy-containing modification group on a surface of the hydrophilic layer; and wherein the performing the surface activation treatment on the hydrophilic layer on the first substrate constituting the detection chip, comprises: placing the first substrate with the hydrophilic layer into a piranha solution and soaking at a temperature condition of 70° C.-90° C. for 12 h-24 h.

\* \* \* \* \*